United States Patent
Ma et al.

(10) Patent No.: US 7,054,675 B2
(45) Date of Patent: May 30, 2006

(54) CUSTOMIZED SPATIAL SATURATION PULSE SEQUENCE FOR SUPPRESSION OF ARTIFACTS IN MR IMAGES

(75) Inventors: Jingfei Ma, Houston, TX (US); Yuval Zur, Haifa (IL)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 280 days.

(21) Appl. No.: 10/059,814

(22) Filed: Jan. 30, 2002

(65) Prior Publication Data

US 2003/0144587 A1  Jul. 31, 2003

(51) Int. Cl.
*A61B 5/55* (2006.01)

(52) U.S. Cl. .................... 600/410; 324/307; 324/309; 324/318; 324/322

(58) Field of Classification Search ............... 600/410, 600/411, 419, 421, 422; 324/307, 309, 306, 324/318, 322
See application file for complete search history.

(56) References Cited

U.S. PATENT DOCUMENTS

| 4,715,383 | A |   | 12/1987 | Ehman et al. |         |
|-----------|---|---|---------|--------------|---------|
| 5,657,757 | A | * | 8/1997  | Hurd et al. .................. | 600/413 |
| 5,664,568 | A | * | 9/1997  | Srinivasan et al. ......... | 600/422 |
| 6,486,668 | B1| * | 11/2002 | Ma ............................ | 324/307 |

FOREIGN PATENT DOCUMENTS

| JP | 02 041136   | A  | 9/1990  |
| JP | 04158840    | A  | 1/1992  |
| JP | 04075638    | A  | 10/1992 |
| JP | 11225992    | A2 | 8/1999  |
| JP | 2002017704  | A2 | 1/2002  |

\* cited by examiner

*Primary Examiner*—Eleni Mantis Mercader
(74) *Attorney, Agent, or Firm*—Quarles & Brady LLP

(57) ABSTRACT

Artifacts in MR images caused by signals emanating from outside the design spherical volume (DSV) of the system are suppressed using customized spatial saturation pulse sequences interleaved with imaging pulse sequences. The spatial saturation pulse sequences are each customized to a specific region and are stored in a library for selective use when needed to suppress artifact producing signals emanating from specific regions outside the DSV.

5 Claims, 3 Drawing Sheets

CUSTOMIZED SPATIAL SATURATION PULSE SEQUENCE FOR SUPPRESSION OF ARTIFACTS IN MR IMAGES

BACKGROUND OF THE INVENTION

The field of the invention is nuclear magnetic resonance imaging methods and systems. More particularly, the invention relates to the reduction of image artifacts caused by signals produced outside the field of view.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins after the excitation signal $B_1$ is terminated, this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

To accurately excite spins and resolve the locations of the resulting NMR signals the polarizing magnetic field $B_0$ must be highly homogeneous and the imaging gradient fields $G_x$, $G_y$, and $G_z$ must be highly linear. Numerous structures and methods are known in the art to accomplish this in commercial MRI system, and the region where these fields meet the requirements is referred to as the designed spherical volume ("DSV"). The DSV may range for example, from a diameter of 40 to 48 cm. Outside the DSV, the polarizing magnetic field $B_0$ can become very inhomogeneous and the imaging gradients $G_x$, $G_y$, and $G_z$ can become highly non-linear. They are also very poorly controlled in these outer regions.

Referring particularly to FIG. 2, the DSV of a typical MRI system is indicated by dashed line 10 and a subject to be scanned 12 is placed in the DSV 10. A field of view (FOV) from which accurate NMR data is acquired to reconstruct an image is indicated by dotted lines 14. Portions of the subject 12 are outside the DSV 10, and the spins therein are subject to the RF excitation fields and magnetic fields produced by the MRI system while imaging the FOV 14. The NMR signals produced by spins located outside the DSV 10 can produce image artifacts. These image artifacts from outside the DSV 10 can be aliased into the reconstructed image because of the limited imaging FOV 14, they can be depicted in the FOV 14 due to system imperfections, or they can also be ghosted into the image because of the data inconsistency.

Methods and apparatus are known to reduce these artifacts. One solution is to increase the imaging FOV 14 to reduce aliasing. Hardware solutions include design of gradient coils with a larger linear region or RF transmit coils which significantly reduce RF excitation of spins outside the DSV 10. These are costly solutions which require major system changes.

Another well known method for suppressing artifact-producing signals emanating from spins located outside the FOV 14 is to interleave spatial saturation pulse sequences with the imaging pulse sequences. As described in U.S. Pat. No. 4,175,383, a spatial saturation pulse sequence suppresses the longitudinal magnetization of the spins in a selected slice or slab outside the FOV 14 by applying a selective RF excitation pulse in the presence of a slice select gradient to excite spins in the selected slice. A spoiler gradient is then applied to dephase the resulting transverse magnetization. Before the longitudinal magnetization in the excited slice can recover, imaging data is acquired from the FOV 14. Because the longitudinal magnetization in the excited slice is suppressed, very little artifact producing signal can be produced in the presaturated slices during the subsequent imaging pulse sequence.

The effectiveness of the spatial saturation method depends on homogeneous $B_0$ and $B_1$ fields and linear gradient fields in the regions outside the FOV 14 to accurately locate the spatial saturation slice and adequately suppress the spin signals therein. Since the regions outside the DSV 10 do not necessarily satisfy these conditions, the spatial saturation method can be ineffective on any given MRI system in any given location depending on the peculiarities of its fields outside the DSV 10.

SUMMARY OF THE INVENTION

The present invention is a method and apparatus for reducing image artifacts caused by signals emanating from outside the DSV. More specifically, it includes the development of a set of spatial saturation pulse sequences which are customized for each MRI system using a calibration method that produces optimal spatial saturation pulse sequence scan parameters for corresponding regions outside the DSV. The RF excitation pulse flip-angle, the slice thickness and the slice location are optimized to suppress signals from specific regions outside the DSV. These customized spatial saturation pulse sequences are stored in the MRI system and may be selectively used by clinicitians to suppress signals from these regions when clinically significant image artifacts are produced in prescribed images.

DESCRIPTION OF THE PREFERRED EMBODIMENT

Figure 1:
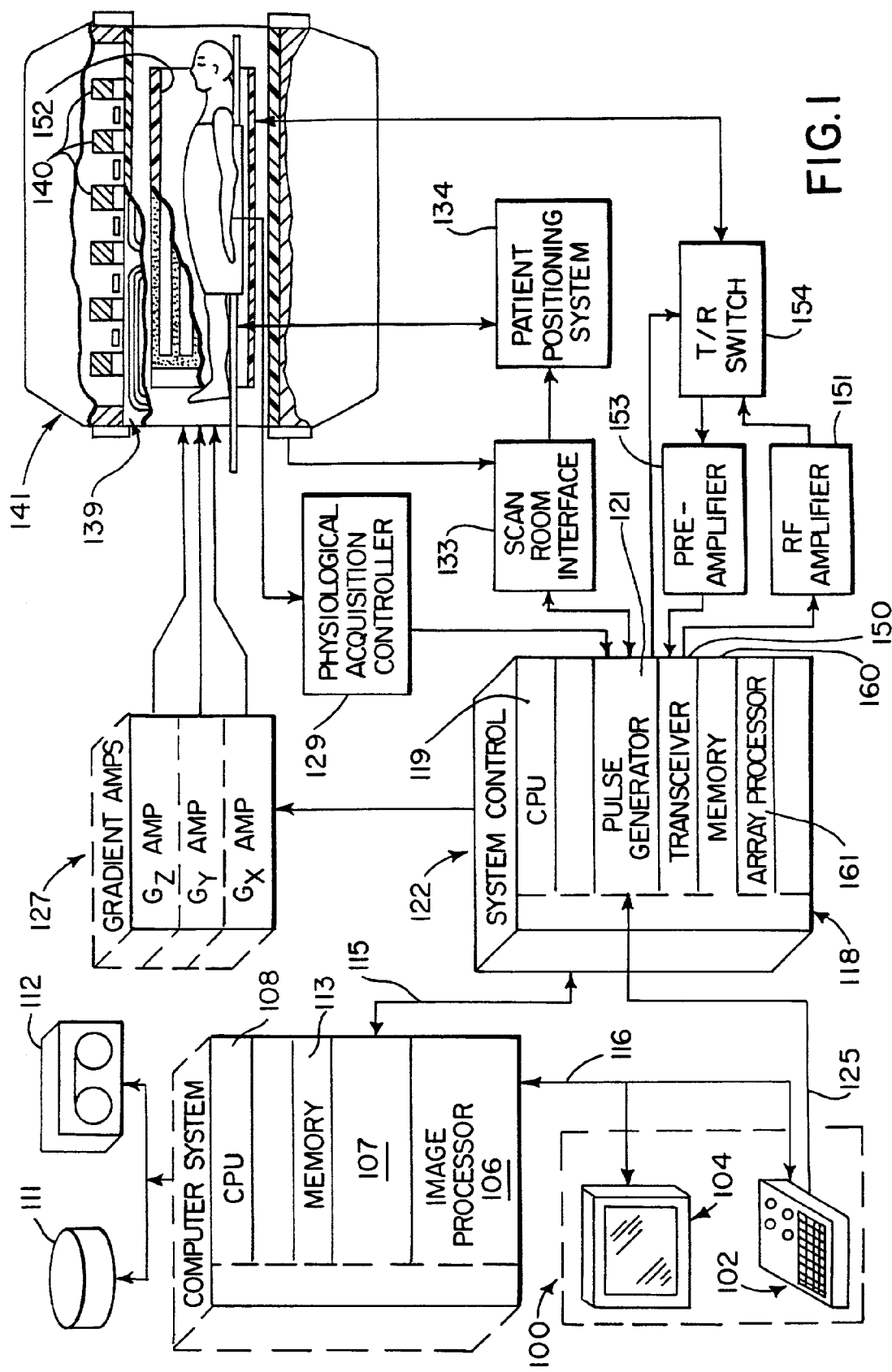
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. A library of pulse sequences are stored by the system control 122 and these may be selected by the operator, who enters specific scan parameters to form the prescribed scan sequence. These selectable pulse sequences include a set of customized spatial saturation sequences which may be selected and interleaved with the prescribed imaging pulse sequence. In response, the pulse generator module 121 produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

Figure 2:
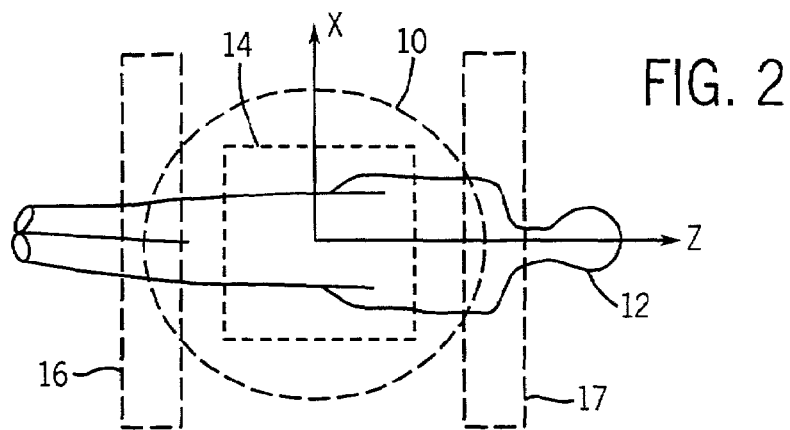
FIG. 2 is a schematic representation of the DSV, FOV regions in the MRI system of FIG. 1.

To acquire an image, the MRI system performs a series of pulse sequences under the direction of the pulse generator 121. There are many imaging pulse sequences known in the art and the present invention may be used with any of them. The prescribed imaging pulse sequence directs the operation of the transceiver 150 to produce RF pulses and receive resulting NMR signals, and it directs the gradient system 127 to produce the required gradient fields $G_x$, $G_y$ and $G_z$. As shown in FIG. 2, the prescribed imaging pulse sequence directs the acquisition of NMR data that will enable an image of the FOV 14 to be reconstructed. The size, shape and orientation of the FOV 14 is determined by the scan parameters of the particular prescribed imaging pulse sequence used during the scan.

Figure 3:
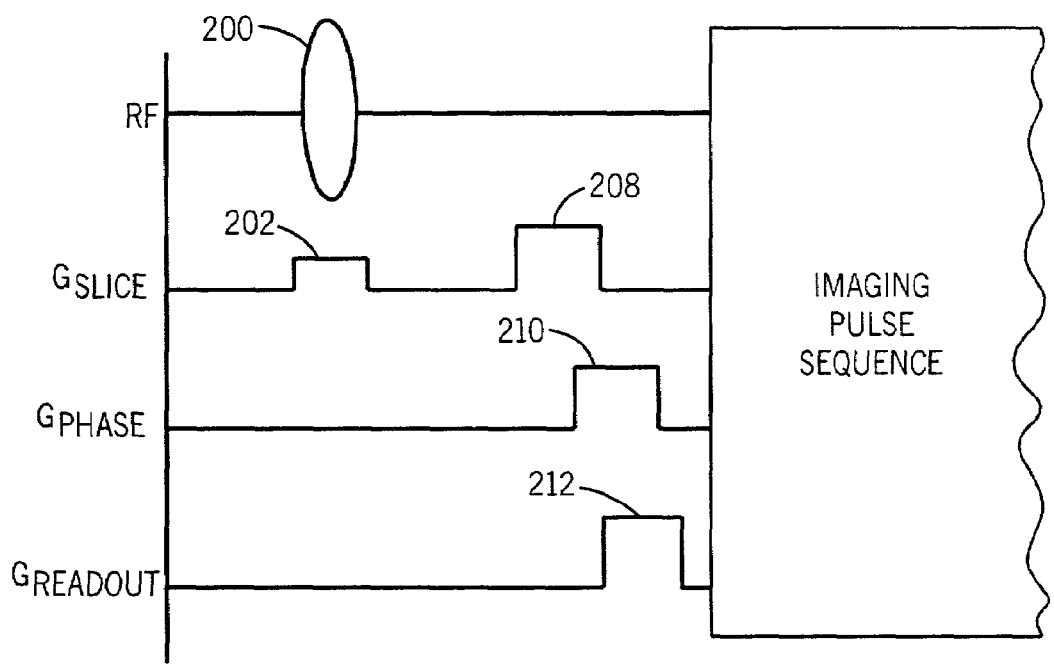
FIG. 3 is a graphic representation of a spatial saturation pulse sequence which is customized according to the present invention.

Referring particularly to FIG. 3, the present invention relates to a customized spatial saturation pulse sequence that may be interleaved with the prescribed imaging pulse sequence during the performance of a scan. This spatial saturation pulse sequence begins with a selective RF pulse 200 having a flip angle α which is applied in the presence of a slice select gradient pulse 202. The slice select gradient 202 has a strength sufficient to excite a slice, or slab, of spins at a desired location along the slice select gradient axis. The frequency bandwidth of the RF pulse 200 determines the thickness of the saturation slice or slab in which spin longitudinal magnetization is suppressed.

The RF pulse employed in conventional spatial saturation pulse sequences has a flip angle of 90° and a frequency bandwidth of approximately 1 kHz at 1.5 Tesla. In the preferred embodiment of the present invention the frequency bandwidth of the RF pulse 200 may range from 5 to 10 kHz and the nominal flip angle ranges from 120° to 180°. In order to achieve the desired high bandwidth, a quadratic phase RF pulse is used for the RF pulse 200. These features enable the selected slice or slab to saturate spin magnetization in a well defined region even though there may be a significant $B_0$ field inhomogeneity outside the DSV 10.

Referring still to FIG. 3, after a slice or slab of spin magnetization has been excited by the RF pulse 200, the resulting transverse magnetization is dephased by a set of spoiler gradient pulses 208, 210 and 212 along the respective imaging gradient axes. As is well known in the art, this dephasing insures that no net NMR signal is produced by the excited spins during the subsequent imaging pulse sequence. Three spoiler gradient pulses 208, 210 and 212 are employed because their linearity, and hence effectiveness of a single gradient outside the DSV 10 is questionable. By applying spoiler gradient pulses along all three axes, the probability that at least one of the gradient fields will be of sufficient magnitude at each location inside the excited slice is substantially increased.

The scan parameters for a set of customized spatial saturation pulse sequences such as that shown in FIG. 3 are stored in the MRI system. These are customized in the sense that each is tailored for use in a specific region around the DSV 10 and each is tailored to suppress spin signals in that region. Referring to FIG. 2, for example, customized spatial saturation sequences may be tailored to suppress spins in regions 16 and 17 located to either side of the DSV 10 along the z axis. The operator may employ the custom spatial saturation pulse sequence corresponding to region 17, for example, if artifacts are generated because the upper portion of the patient body resides in system "hot spots". Additional customized spatial saturation pulse sequences may also be selected and interleaved with the prescribed imaging pulse sequences if they are needed to suppress image artifacts caused by signals emanating from other regions outside the DSV 10. As a general rule, the number of customized spatial saturation pulse sequences used during a scan is kept to a minimum in order to reduce total scan time and patient RF power deposition.

Figure 4:
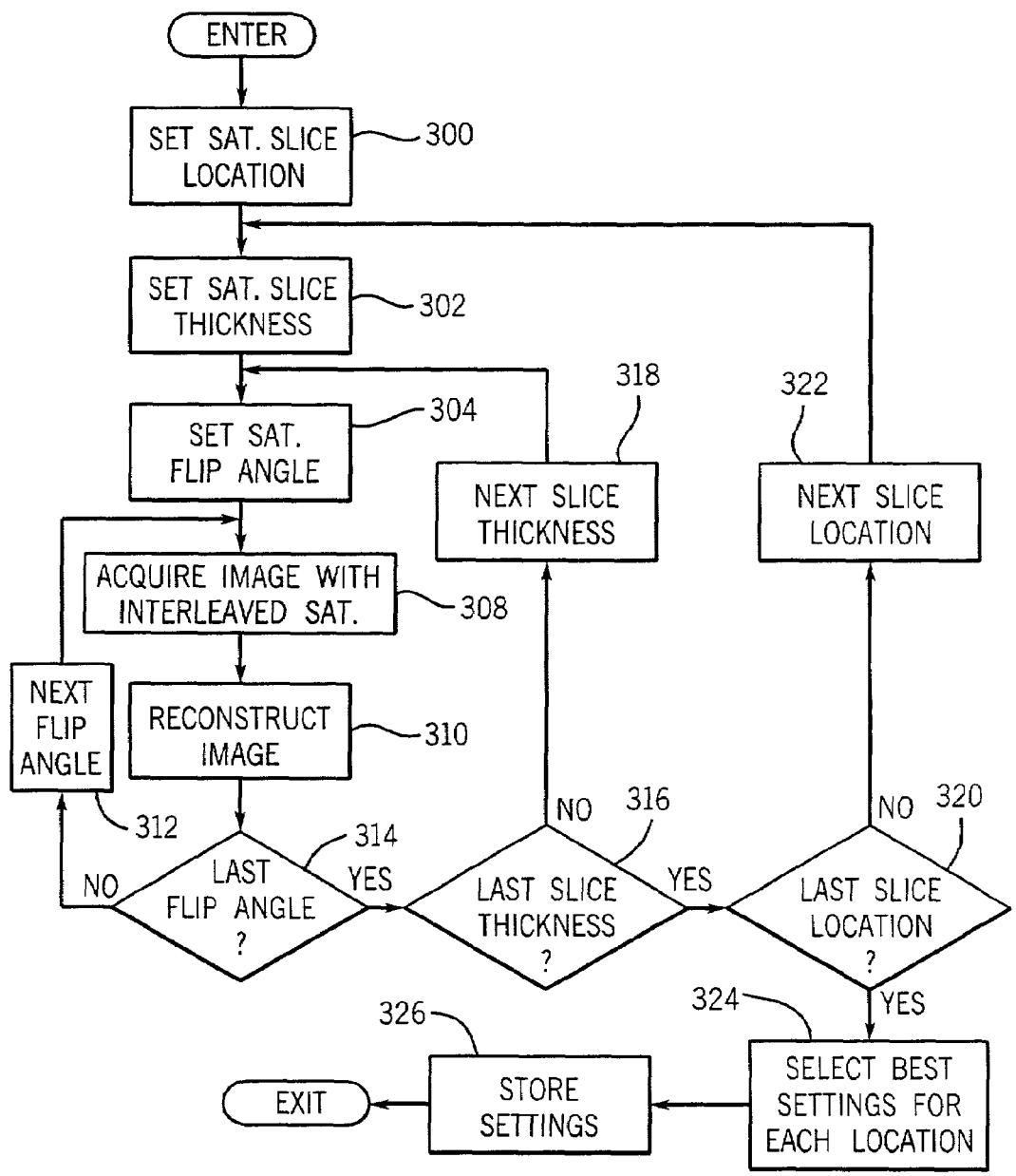
FIG. 4 is a flow chart of the calibration process used to develop the customized spatial saturation pulse sequences for the MRI system of FIG. 1.

The set of stored and selectable customized spatial saturation pulse sequences are produced during a calibration process that is performed when the MRI system is first constructed and whenever changes are made to the MRI system that might affect the homogeneity of the polarizing and RF fields or the linearity of the gradient fields. This calibration process is illustrated in FIG. 4 and it is performed with a phantom placed in the MRI system. The phantom is made of a substance which produces a strong NMR signal when excited, and it is made large enough to occupy all the regions that can potentially generate peripheral signal artifacts outside the DSV 10 (i.e., the system "hot spots").

Referring particularly to FIG. 4, the calibration process is an iterative process in which the saturation pulse settings are methodically sequenced through a set of values for each region, or saturation pulse sequence slice location. As indicated above, these regions are located around the DSV 10 along each of the three gradient axes. As indicated at process block 300, one of these regions serves as a starting point and the RF excitation pulse 200 and slice select gradient pulse 202 are set to select the center of this region. An initial slice thickness is also set at process block 302, which in the preferred embodiment, is the thickness of the selected region. The flip angle of the RF excitation pulse is then set at process block 304 and in the preferred embodiment the initial setting is 120°. A loop is then entered at 306 in which an image is acquired at 308 and reconstructed at 310. The nominal flip angle is incremented at process block 312 by 10° and the acquisition and reconstruction are repeated. When the flip angle reaches 180°, as determined at decision block 314, this loop 306 is exited.

The imaging pulse sequence used in this acquisition 308 can be a conventional spin-echo pulse sequence which acquires an image from the entire DSV 10 and surrounding regions including the system hot spots. The saturation pulse sequence under test is interleaved with the imaging pulse sequences. The phantom is placed in the selected region being tested and the image reveals any NMR signals which are produced. When the saturation pulses are not applied the selected spin-echo pulse sequence should produce an accurate image of the phantom. However, parts of the image corresponding to the system hot spots will be much brighter (can be an order of magnitude more intense). Some of this intensity will typically ghost into other regions of the image along the phase encoding axis.

The optimization process illustrated in FIG. 4 operates to minimize these regions of intense brightness and the ghosts which they produce using an optimal set of spatial saturation pulse sequence parameters. This is done by testing different slice thicknesses as indicated at decision block 316 and process block 318, and by testing different slice locations as indicated at decision block 320 and process block 322. The final optimal slice thickness for proper saturation should be large enough to cover the entire region of any hot spots with a comfortable margin, but not so large as to interfere with any desired FOV.

After all the flip-angles are tested, the process loops back to test different slice thicknesses at decision block 316. The slice thickness of the saturation pulse sequence is incremented at 318 and the process loops back to process block 304 to test each possible flip angle setting at this slice thickness setting.

When the last slice thickness setting has been tested as determined at decision block 316, the next slice location is tested. In the preferred embodiment slice thicknesses are tested in increments of a percentage of the thickness of the region to be saturated.

The system loops back at decision block 320 to test the next slice location as indicated at process block 322. The system loops back to process block 302 to test each slice thickness and flip angle at the new slice location. When all of the slice locations have been fully tested as determined at decision block 320, the collection of calibration images is complete.

As indicated at process block 324, the calibration images are examined for each slice location and the optimal slice thickness and flip angle settings are determined. The optimal settings are those which best suppress all signals in the reconstructed image including the ghost signals from the system hot spots and which have the minimum slice thickness and minimum flip-angle. As indicated at process block 326, the optimal settings, or scan parameters, for each saturation region outside the DSV 10 are then stored in the system control memory 160.

In the preferred embodiment only two saturation regions are defined outside the DSV 10 because with the elongated shape of the human body, only the system hot spots located along the superior and inferior directions from the DSV 10 are likely to produce artifacts. The optimal settings for the customized saturation pulse sequence for each of these regions is stored in memory 160. These customized saturation pulse sequences are available to the operator as a tool for suppressing image artifacts emanating from spins located outside the DSV 10.

One aspect of the invention is the selective implementation of these customized saturation pulse sequences. In a conventional implementation, spatial saturation is applied for every image slice or once during every n acquired slices. In order to minimize the gradient field and RF field demand on the system, as well as to reduce the RF heating deposition in the imaged subject, it is contemplated that the customized saturation pulse sequences will be applied only when needed to suppress artifacts produced by system hot spots. Such artifacts will not occur in all cases, depending on the location and orientation of the prescribed image slices or volume.

The invention claimed is:

1. A method for producing a customized spatial saturation pulse sequence for calibrating a magnetic resonance imaging (MRI) system to suppress NMR signals emanating from a region located substantially outside a designed spherical volume (DSV) in the MRI system, the steps comprising:
   a) locating a phantom in the region;
   b) iteratively acquiring and reconstructing a set of images with the MRI system;
   c) interleaving a spatial saturation pulse sequence with imaging pulse sequences used in step b) and changing a flip-angle and a slice thickness scan parameter of the spatial saturation pulse sequence as the set of images are acquired;

d) selecting optimal scan parameters to form a spatial saturation pulse sequence that is customized to suppress signals emanating from the region by analyzing the set of images; and e) storing the optimal scan parameters in the MRI system to calibrate the system.

2. The method as recited in claim 1 in which the flip-angle is changed over a range of 120° to 180° during the performance of step b).

3. The method as recited in claim 1 in which different slice thicknesses are employed and the flip-angle is changed over a range of 120° to 180° for each value of the slice thickness such that images are produced using all combinations of spatial saturation pulse sequence scan parameters.

4. The method as recited in claim 1 in which the phantom is located to reside in MRI system hot spots.

5. The method as recited in claim 4 in which step d) is performed by selecting scan parameters which suppress the signals from the MRI system hot spots.

* * * * *